United States Patent
Park

(10) Patent No.: US 9,397,039 B2
(45) Date of Patent: Jul. 19, 2016

(54) SEMICONDUCTOR DEVICE AND METHOD FOR FORMING THE SAME

(71) Applicant: SK hynix Inc., Icheon-si, Gyeonggi-do (KR)

(72) Inventor: Min Su Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 286 days.

(21) Appl. No.: 14/148,068

(22) Filed: Jan. 6, 2014

(65) Prior Publication Data

US 2015/0091185 A1    Apr. 2, 2015

(30) Foreign Application Priority Data

Sep. 30, 2013   (KR) .................. 10-2013-0116513

(51) Int. Cl.
*H01L 23/522*    (2006.01)
*H01L 23/528*    (2006.01)

(52) U.S. Cl.
CPC .......... *H01L 23/5226* (2013.01); *H01L 23/522* (2013.01); *H01L 23/5286* (2013.01); *H01L 2924/0002* (2013.01)

(58) Field of Classification Search
CPC ............... H01L 23/5226; H01L 21/76877; H01L 21/76802; H01L 23/522; H01L 23/5286; H01L 2924/0002; H01L 2924/00
See application file for complete search history.

(56) References Cited

U.S. PATENT DOCUMENTS 6,717,267 B1 *  4/2004  Kunikiyo ............ H01L 23/5283
                                                              257/758
7,288,786 B2 * 10/2007  Janke ............... G06K 19/07363
                                                              257/211

FOREIGN PATENT DOCUMENTS

KR       1020100063497 A      6/2010

* cited by examiner

*Primary Examiner* — Roy Potter
(74) *Attorney, Agent, or Firm* — William Park & Associates Ltd.

(57) ABSTRACT

A semiconductor device includes: a second conductive layer formed over a first conductive layer; and a dummy conductive layer formed between the first and second conductive layers with through-holes formed therein. The first and second conductive layers include signal lines electrically coupled to each other through signal metal contacts passing through the through-holes, and the second conductive layer includes power lines electrically coupled to the dummy conductive layer through power metal contacts.

19 Claims, 4 Drawing Sheets

SEMICONDUCTOR DEVICE AND METHOD FOR FORMING THE SAME

CROSS-REFERENCES TO RELATED APPLICATION

The present application claims priority under 35 U.S.C. §119(a) to Korean application number 10-2013-0116513, filed on Sep. 30, 2013, in the Korean Intellectual Property Office, which is incorporated herein by reference in its entirety.

BACKGROUND

1. Technical Field

Various embodiments relate to a semiconductor device having conductive lines and a method for forming the same.

2. Related Art

According to the recent semiconductor technology, conductive lines are arranged in a multilayer structure through miniaturization and high integration. The multilayer conductive lines had been arranged according to a conductive line layout including three layers, but have been recently arranged according to a conductive line layout including two layers, due to the cost.

However, since the conductive line layout including two layers has a smaller number of power lines than the conductive line layout including three layers, a defect may occur due to the reduction of power.

Furthermore, as the interval between the conductive layers of the conductive line layout including two layers is reduced through the miniaturization and high integration of the semiconductor technology, coupling capacitance may occur between conductive lines arranged in the respective conductive layers.

SUMMARY

Various embodiments are directed to a semiconductor device capable of increasing power.

Various embodiments are directed to a semiconductor device capable of preventing coupling capacitance from occurring between conductive lines.

In an embodiment of the present invention, a semiconductor device includes: a second conductive layer formed over a first conductive layer; and a dummy conductive layer formed between the first and second conductive layers with through-holes formed therein. The first and second conductive layers include signal lines electrically coupled to each other through signal metal contacts passing through the through-holes, and the second conductive layer includes power lines electrically coupled to the dummy conductive layer through power metal contacts.

In an embodiment of the present invention, a method for forming a semiconductor device includes the steps of: forming a first insulating layer over a first conductive layer including signal lines; forming a dummy conductive layer having through-holes over the first insulating layer; forming a second insulating layer over the dummy conductive layer; forming signal metal contacts in the first and second insulating layers to pass through the through-holes, and forming power metal contacts in the second insulating layer; and forming a second conductive layer including signal lines and power lines over the second insulating layer.

In an embodiment of the present invention, a semiconductor device comprises: a first conductive layer; a second conductive layer including signal lines formed over the first conductive layer including signal lines; a dummy conductive layer including through-holes formed between the first conductive layer and the second conductive layer, wherein the first and second conductive layers are electrically coupled to each other through signal metal contacts passing through the through-holes.

In an embodiment of the present invention, a system comprises: a processor; a controller configured to receive a request and a data from the processor; and a memory unit configured to receive the request and the data from the controller, wherein the memory unit includes: a second conductive layer formed over a first conductive layer; and a dummy conductive layer formed between the first and second conductive layers with through-holes formed therein, wherein the first and second conductive layers comprise signal lines electrically coupled to each other through signal metal contacts passing through the through-holes, and the second conductive layer comprises power lines electrically coupled to the dummy conductive layer through power metal contacts.

BRIEF DESCRIPTION OF THE DRAWINGS

Features, aspects, and embodiments are described in conjunction with the attached drawings, in which.

DETAILED DESCRIPTION

Figure 1:
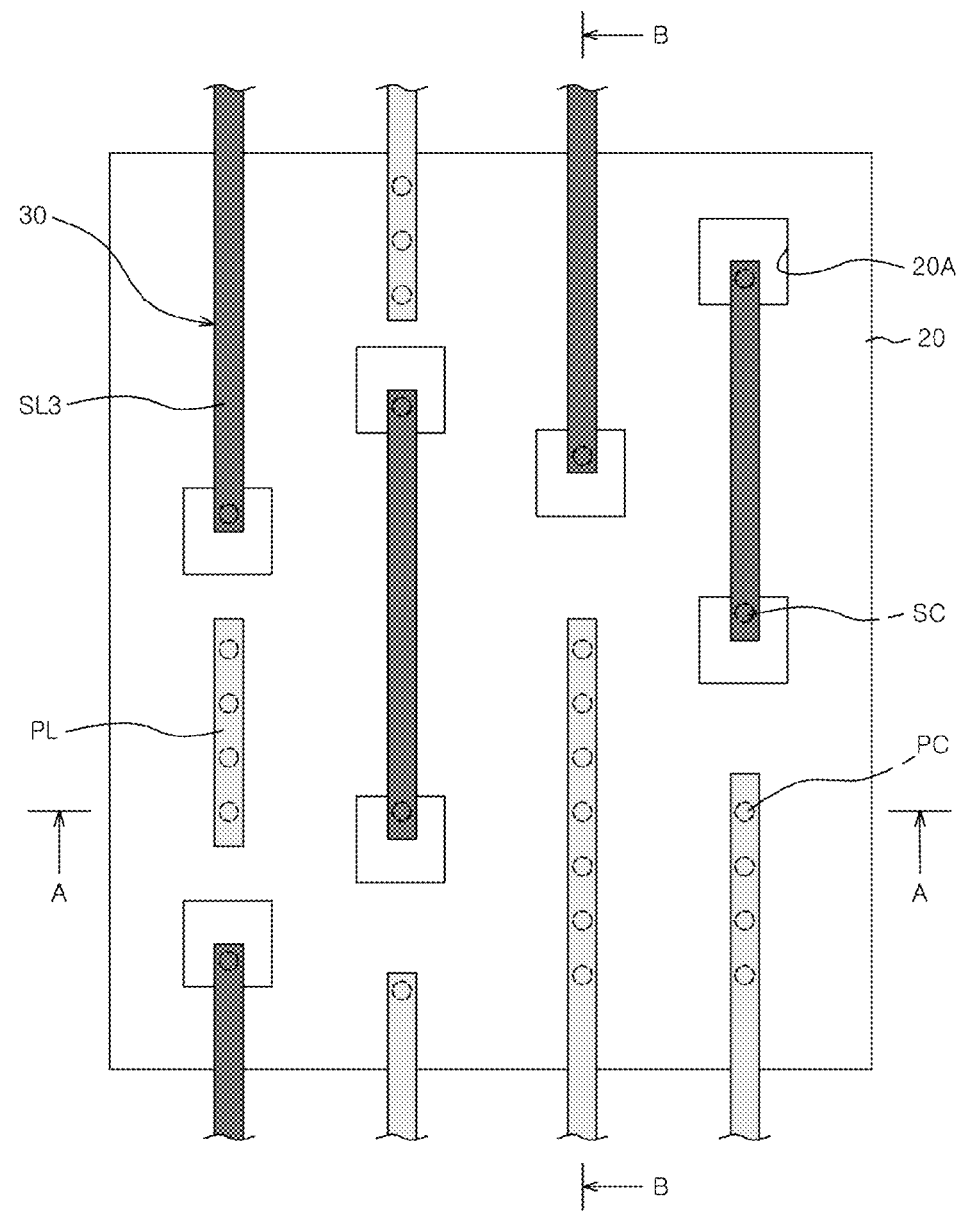
FIG. 1 is a schematic plan view of a semiconductor device according to an embodiment of the present invention.
Figure 2:
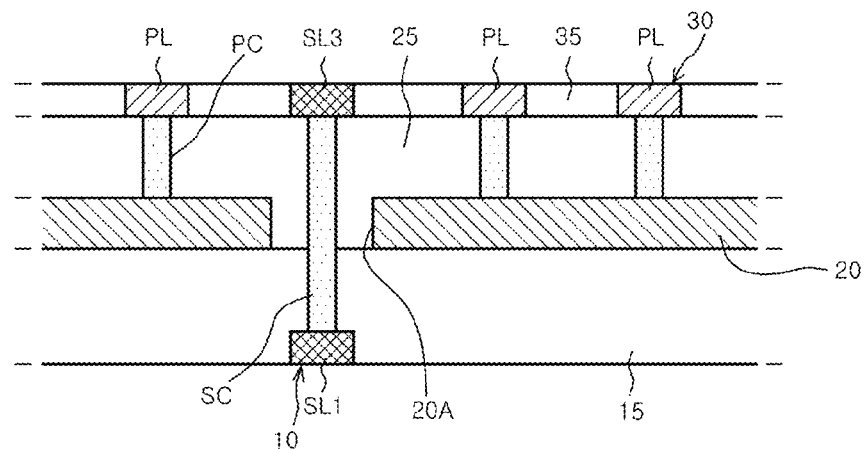
FIG. 2 is a cross-sectional view taken along line A-A of FIG. 1.
Figure 3:
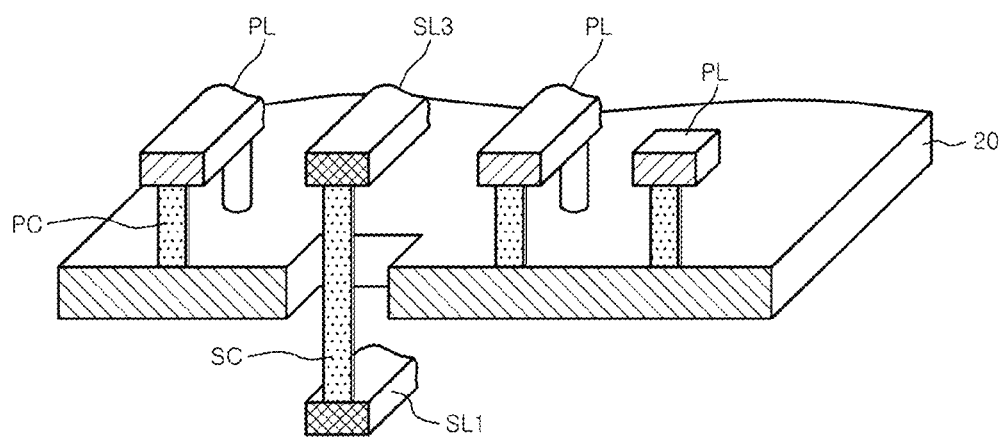
FIG. 3 is a perspective view of FIG. 2.
Figure 4:
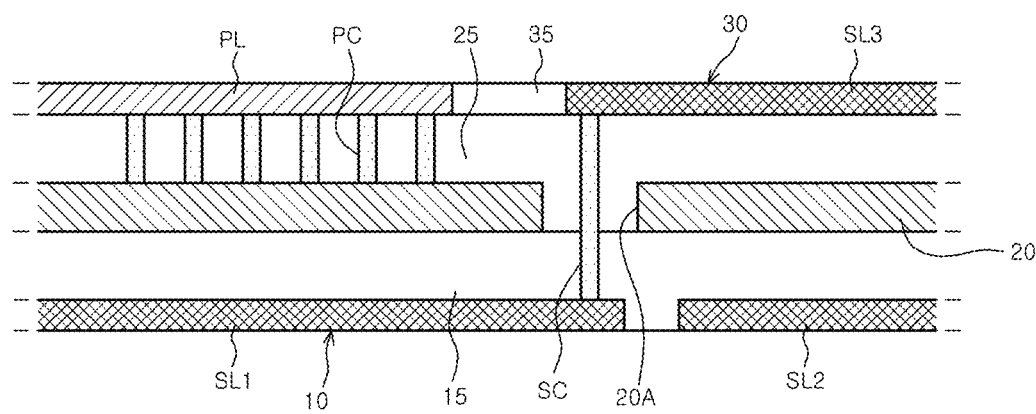
FIG. 4 is a cross-sectional view taken along line B-B of FIG. 1.
Figure 5:
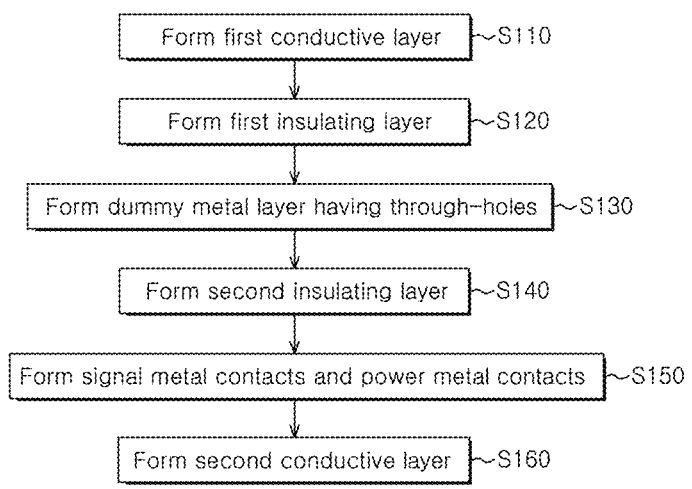
FIG. 5 is a flowchart for explaining a method for forming a semiconductor device according to an embodiment of the present invention.

Hereinafter, a semiconductor device and a method for forming the same according to the present invention will be described below with reference to the accompanying drawings through various embodiments. FIG. 1 is a schematic plan view of a semiconductor device according to an embodiment of the present invention, FIG. 2 is a cross-sectional view taken along line A-A of FIG. 1, FIG. 3 is a perspective view of FIG. 2, and FIG. 4 is a cross-sectional view taken along line B-B of FIG. 1. FIGS. 1 and 3 are a plan view and a cross-sectional view of a semiconductor device according to an embodiment of the present invention. In FIGS. 1 and 3, the illustration of an insulating layer is omitted.

Referring to FIGS. 1 to 4, the semiconductor device according to an embodiment of the present invention, that is, a conductive line layout includes a first conductive layer 10, a second conductive layer 30 formed over the first conductive layer 10, and a dummy conductive layer 20 formed between the first and second conductive layers 10 and 30.

The first conductive layer 10 may include a plurality of signal lines SL1 and SL2 arranged therein. The signal lines SL1 and SL2 may include wirings for transmitting signals such as logic high or logic low signals or reference power signals.

The plurality of signal lines SL1 and SL2 may include a first signal line SL1 and a second signal line SL2. The first and second signal lines SL1 and SL2 may be arranged to be spaced from each other.

The second conductive layer 30 may include a plurality of power lines PL and a plurality of signal lines SL3. The power lines PL may include wirings for transmitting a power supply voltage or ground voltage. The signal lines SL3 may include wirings for transmitting signals such as logic high or logic low signals or reference power signals, like the signal lines SL1 and SL2 of the first conductive layer 10. Moreover, FIG. 1 illustrates a distance A between the power lines PL and the power metal contacts PC, and a distance B between the signal lines SL3.

The power lines PL and the signal lines SL3 of the second conductive layer 30 (for example, the third signal lines SL3) may be alternately arranged in the second conductive layer 30. In other words, the power lines PL are arranged to be spaced at a predetermined distance from each other.

The third signal line SL3 may be electrically coupled to the first signal line SL1 through a signal metal contact SC, and may not be coupled to the second signal line SL2. Accordingly, the third signal line SL3 in the second conductive layer 30 may not be coupled to the second signal line SL2 of the first conductive layer 10.

The dummy conductive layer 20 is formed between the first and second conductive layers 10 and 30 as described above. The dummy conductive layer 20 may be electrically coupled to the power lines PL of the second conductive layer 30 through power metal contacts PC, thereby forming a power mesh.

For example, the dummy conductive layer (20) may be a plate electrode (PLT), and the plate electrode disposed between one conductive layer and another conductive layer of microfarad (μF) capacitor used as a decoupling capacitor in peri region.

Furthermore, the dummy conductive layer 20 includes a plurality of through-holes 20A formed therein, through which the signal metal contact SC passes to electrically couple the first signal line SL1 and the third signal line SL3. The plurality of through-holes 20A is not coupled to the second signal line SL2.

In other words, the signal metal contact SC may electrically couple to the first and third signal lines SL1 and SL3 in a state where the signal metal contact SC passes through the through-hole 20A of the dummy conductive layer 20 so as not to be interconnected to the dummy conductive layer 20.

When the first and third signal conductive lines SL1 and SL3 are directly coupled to each other in a state where the signal metal contact SC is not coupled to the dummy conductive layer 20 disposed between the first and second conductive layers 10 and 30, undesired coupling capacitance does not occur between the first conductive layer 10 and the second conductive layer 30.

More specifically, when a signal is transmitted between the third signal line SL3 and the first signal line SL1, coupling capacitance may occur in the second signal line SL2 due to the signal of the third signal line SL3. In an embodiment, as the dummy conductive layer 20 is disposed between the first and second conductive layer 10 and 30, it is possible to prevent the occurrence of coupling capacitance between the second and third signal lines SL2 and SL3. The dummy conductive layer 20 may not be coupled to the second signal SL2 of the first conductive layer 10.

Reference numeral 15 represents a first insulating layer formed over the first conductive layer 10, reference numeral 25 represents a second insulating layer formed over the dummy conductive layer 20, and reference numeral 35 represents a third insulating layer formed over the second conductive layer 30. The first insulating layer 15 may be formed between the first conductive layer 10 and the dummy conductive layer 20. The second insulating layer 25 may be formed between the second conductive layer 30 and the dummy conductive layer 20. The dummy conductive layer 20 may be formed over the first insulating layer 15.

Hereafter, a method for forming a semiconductor device according to an embodiment of the present invention will be described.

Referring to FIGS. 1 to 5, a first conductive layer 10 is formed at step S110. The first conductive layer 10 may include a plurality of signal lines including first and second signal lines SL1 and SL2.

The signal lines SL1 and SL2 of the first conductive layer 10 may be formed through spacer patterning technology (SPT) in which a metallic material and a hard mask are stacked over a substrate and then patterned. In an embodiment, various methods may be applied as long as the signal lines can be formed.

Then, a first insulating material is stacked over the first conductive layer 10 so as to form a first insulating layer 15, at step S120. During this process, the first insulating material may gap-fill the space between the signal lines SL1 and SL2. Furthermore, compared to a typical conductive line layout including three layers, a process of forming a contact over the first insulating layer 15 may be omitted. Thus, the process of forming the conductive line layout may be simplified.

Then, a dummy conductive layer 20 is formed over the first insulating layer 15, and a through-hole 20A is formed in the dummy conductive layer 20 such that a signal metal contact SC to be formed during a subsequent process passes through the through-hole 20A, at step S130. The through-hole 20A may be formed through various techniques such as SPT. Accordingly, the signal metal contact SC is not coupled with the dummy conductive layer 20.

Then, a second insulating material is stacked over the dummy conductive layer 20 so as to form a second insulating layer 25, at step S140. During this process, the second insulating material may gap-fill the through-hole 20A. At this time, the second insulating material may have the same etch ratio as the first insulating material for forming the insulating layer 15.

Then, a plurality of metal contacts are formed over the second insulating layer 25 at step S150. At this time, the metal contacts may include a plurality of power metal contacts PC and a plurality of signal metal contacts SC. The plurality of power metal contacts PC electrically couple a plurality of power lines PL of a second conductive layer 30, which is to be formed during a subsequent process, to the dummy conductive layer 20. The plurality of signal metal contacts SC electrically couple a plurality of third signal lines SL3 of the second conductive layer 30 to the first signal lines SL1 of the first conductive layer 10 and pass through the through-holes 20A of the dummy conductive layer 20, respectively.

During the process, the signal metal contacts SC may be formed in the first insulating layer 15 and the second insulating layer 25 may be formed at the same time as the power metal contacts PC formed in the second insulating layer 25, because the through-holes 20A are already formed during the previous process.

Then, the second conductive layer 30 is formed over the entire structure at step S160. The second conductive layer 30 may include the plurality of power lines PL and the plurality of signal lines SL3.

Thus, in an embodiment, the dummy conductive layer 20 is disposed between the first and second conductive layers 10 and 30, and the plurality of power lines PL formed in the second conductive layer 30 are electrically coupled to the dummy conductive layer 20 through the respective power metal contacts PC. Thus, the power may be increased.

Furthermore, since the plurality of signal lines SL1 and SL3 arranged in the first and second conductive layers 10 and 30 are electrically coupled through the signal metal contacts SC passing through the through-holes 20A formed in the dummy conductive layer 20, it is possible to prevent the occurrence of coupling capacitance between the first and second conductive layers 10 and 30.

Furthermore, it is possible to omit a process of forming contacts in the first insulating layer 15, compared to a typical conductive line layout including three layers.

Figure 6:
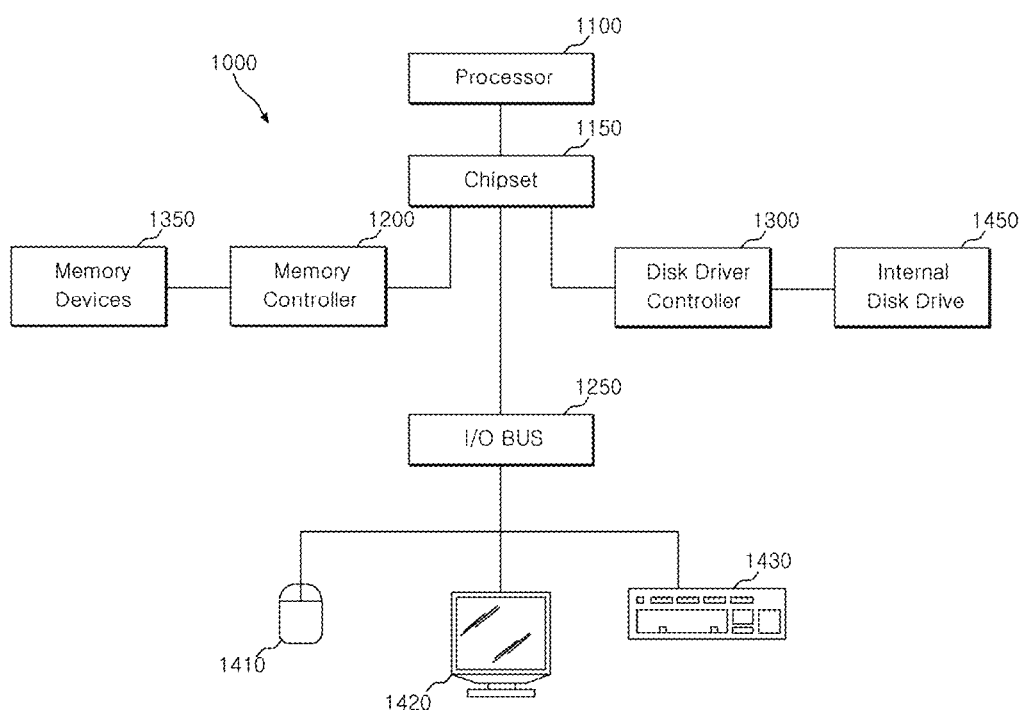
FIG. 6 illustrates a block diagram of a system employing a memory controller circuit in accordance with an embodiment of the invention.

Referring to FIG. 6, a system 1000 may include one or more processors or central processing units ("CPUs") 1100. The CPU 1100 may be used individually or in combination with other CPUs.

A chipset 1150 may be operably coupled to the CPU 1100. The chipset 1150 may be a communication pathway for signals between the CPU 1100 and other components of the system 1000, which may include a memory controller 1200, an input/output ("I/O") bus 1250, and disk drive controller 1300. Depending on the configuration of the system, any one of a number of different signals may be transmitted through the chipset 1150.

The memory controller 1200 may be operably coupled to the chipset 1150. The memory controller 1200 may include at least one memory controller which delays the generation of the address signal, and blocks consecutive accesses, of which the number exceeds the predetermined critical value, to the same word line or the same bit line of a selected memory bank of the memory unit. Thus, the memory controller 1200 can receive a request from the CPU 1100, through the chipset 1150. The memory controller 1200 may be operably coupled to one or more memory devices 1350. The semiconductor device described above may be included in the memory devices 1350. The memory devices 1350 may be any one of a number of industry standard memory types, including but not limited to, single inline memory modules ("SIMMs") and dual inline memory modules ("DIMMs"). The memory devices 1350 may facilitate the safe removal of the external data storage devices by storing both instructions and data.

The chipset may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communication with each other or with the chipset 1150 using virtually any type of communication protocol, including all of those mentioned above with regard to the I/O bus 1250.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
    a second conductive layer formed over a first conductive layer; and
    a dummy conductive layer formed between the first and second conductive layers with through-holes formed therein,
    wherein the first and second conductive layers comprise signal lines electrically coupled to each other through signal metal contacts passing through the through-holes, and
    the second conductive layer comprises power lines electrically coupled to the dummy conductive layer through power metal contacts.

2. The semiconductor device according to claim 1, wherein the through-holes are formed at positions corresponding to the respective signal metal contacts.

3. The semiconductor device according to claim 1, wherein the signal metal contacts are not coupled with the dummy conductive layer.

4. The semiconductor device according to claim 1, wherein a first insulating layer is formed between the first conductive layer and the dummy conductive layer, and a second insulating layer is formed between the second conductive layer and the dummy conductive layer.

5. The semiconductor device according to claim 1, wherein the power lines and the signal lines are alternately arranged in the second conductive layer.

6. The semiconductor device according to claim 1, wherein the dummy conductive layer is a plate electrode.

7. A method for forming a semiconductor device, comprising the steps of:
    forming a first insulating layer over a first conductive layer including signal lines;
    forming a dummy conductive layer having through-holes over the first insulating layer;
    forming a second insulating layer over the dummy conductive layer;
    forming signal metal contacts in the first and second insulating layers to pass through the through-holes, and forming power metal contacts in the second insulating layer; and
    forming a second conductive layer including signal lines and power lines over the second insulating layer.

8. The method according to claim 7, wherein the signal metal contacts electrically couple the signal lines of the first conductive layer to the signal lines of the second conductive layer in a state where the signal metal contacts pass through the through-holes so as not to be coupled to the dummy conductive layer.

9. The method according to claim 7, wherein the through-holes are formed at positions corresponding to the signal metal contacts.

10. The method according to claim 7, wherein an insulating material forming the second insulating layer gap-fills the through-holes during the step of forming the second insulating layer.

11. The method according to claim 10, wherein an insulating material forming the first insulating layer and the insulating material forming the second insulating layer have substantially the same etch ratio.

12. The method according to claim 7, wherein the power metal contacts electrically couple the power lines of the second conductive layer to the dummy conductive layer.

13. A semiconductor device comprising:
a first conductive layer;
a second conductive layer including signal lines formed over the first conductive layer including signal lines; and
a dummy conductive layer including through-holes formed between the first conductive layer and the second conductive layer,
wherein the first and second conductive layers are electrically coupled to each other through signal metal contacts passing through the through-holes.

14. The semiconductor device of claim 13, wherein the dummy conductive layer is electrically coupled to power lines through power metal contacts.

15. The semiconductor device of claim 13, wherein the signal lines of the first conductive layer and the signal lines of the second conductive layer are coupled where the signal metal contacts are not coupled to the dummy conductive layer.

16. The semiconductor device of claim 14, wherein the power lines are configured to be paced at a predetermined distance from each other and the signal lines of the second conductive layer maybe configured between the power lines.

17. The semiconductor device of claim 13, wherein the signal lines of the second conductive layer are not coupled to one or more of the signal lines of the first conductive layer.

18. The semiconductor device of claim 13, wherein the plurality of through-holes is not coupled to one or more of the signal lines of the first conductive layer.

19. The semiconductor device of claim 13, wherein the dummy conductive layer is not coupled to one or more of the signal lines of the first conductive layer.

* * * * *